United States Patent [19]
Fukuzawa et al.

[11] Patent Number: 6,136,622
[45] Date of Patent: Oct. 24, 2000

[54] ORGANIC EL DEVICE AND METHOD OF MANUFACTURING THE SAME

[75] Inventors: Shinichi Fukuzawa; Hiroshi Suzuki, both of Tokyo, Japan

[73] Assignee: NEC Corporation, Tokyo, Japan

[21] Appl. No.: 09/200,520

[22] Filed: Nov. 25, 1998

[30] Foreign Application Priority Data

Nov. 26, 1997 [JP] Japan .................................... 9-324088

[51] Int. Cl.[7] .................................................. H01L 21/00
[52] U.S. Cl. ............................ 438/26; 428/29; 313/498; 313/505; 313/506
[58] Field of Search .................................. 438/26, 27, 28, 438/29, 99; 313/458, 505, 506, 507, 508, 509

[56] References Cited

U.S. PATENT DOCUMENTS

| | | | |
|---|---|---|---|
| 5,614,353 | 3/1997 | Kumar et al. ............................ | 430/313 |
| 5,814,417 | 9/1998 | Nagayama ............................... | 313/506 |
| 5,955,837 | 9/1999 | Horikx et al. ........................... | 313/506 |

FOREIGN PATENT DOCUMENTS 9-50888  2/1997  Japan .

*Primary Examiner*—Kevin M. Picardat
*Attorney, Agent, or Firm*—Scully, Scott, Murphy & Presser

[57] ABSTRACT

An EL device is provided by a method by forming a plurality of stripes of a first transparent electrode on a transparent substrate extending in one direction of the substrate, forming a plurality of stripes of an insulating partition wall on said first electrode in a direction perpendicular to said first electrode stripes, forming an organic layer and a second electrode in sequence on the partition wall stripes, adhering a sealing glass cap so as to cover all of the above layers and evacuating the inside of said sealing glass cap, and irradiating a laser light from the outside of the sealing glass cap toward the partition wall stripes so as to separate the second electrode to form a divided groove on the partition wall. Since the separation of the second electrode by fusion is carried out in a vacuum, so that the chips of metal evaporated by the photo-ablation stick on the inside wall of the glass cap without contaminating the inside of the divided portion, which results in the prevention of shorting of the second electrode and increases the manufacturing yields in the manufacturing process.

6 Claims, 8 Drawing Sheets

ORGANIC EL DEVICE AND METHOD OF MANUFACTURING THE SAME

BACKGROUND OF THE INVENTION

1. Field of the Invention

This invention relates to a method of manufacturing an EL (Electro Luminescence) device.

This application is based on Patent Application No. Hei 9-324088 filed in Japan, the content of which is incorporated herein by reference.

2. Background Art

Recently, new methods have been proposed to apply laser machining in manufacturing organic EL devices. For example, a method, shown in FIG. 6, is disclosed in Japanese Patent Application, First Publication No. Hei 9-50888.

This method first forms a transparent anode 102 on a surface of a transparent glass substrate, as shown in FIG. 6A, and then forms a laser protective layer 103, which is an insulating layer, excluding pixel areas for forming pixels 108, as shown in FIG. 6B. Subsequently, after a luminescence layer 104 made of an organic material and a cathode material layer 105 are formed by vacuum deposition, as shown in FIG. 6C, the cathode 106 is formed by evaporating a part of the luminescence layer 104 and the cathode layer 105 included in the laser machining portion 107 by irradiating from the top of the laser machining portion 107 a laser light emitted by a YAG laser or an excimer laser; and thereby an organic EL device having a plurality of pixels corresponding to the pixel areas is formed.

Another manufacturing method is shown in FIG. 7. This method first forms a transparent anode 102 on a surface of a glass substrate 101 (FIG. 7A), forms a luminescence layer 104 made of an organic material and a cathode material layer 105 successively by vacuum deposition (FIG. 7B), and forms a laser absorption layer 109, the surface of which has a lower reflectance than that of the cathode material (FIG. 7C). Subsequently, after forming a laser absorption layer 109, a cathode 106 is formed by evaporating the laser machining portion and the cathode layer by irradiating from the top of the laser machining portion 107 a laser light emitted by a YAG laser or an excimer laser to obtain an organic EL device having a plurality of pixels corresponding to pixel areas.

The other method of manufacturing the organic EL device is shown in FIG. 8. In this method, a transparent anode is formed on a transparent glass substrate 101 (FIG. 8A), and a laser protective layer 103 is formed thereon with the exception of areas for forming pixels 108 (FIG. 8B). A luminescence layer 104 made of an organic material and a cathode material layer 105 are successively formed by vacuum deposition (FIG. 8C). After forming a laser absorption layer 111, the surface of which has lower reflectance than the cathode material layer (FIG. 8D), the luminescence layer 104 and the cathode material layer 105 are removed by evaporation by irradiating from the top of the laser machining portion 107 a laser light of a YAG laser or an excimer laser to form the cathode 106 (FIG. 8E); thereby, an organic EL device having a plurality of pixels 108 corresponding to pixel areas is obtained.

In the above described conventional manufacturing methods disclosed in Japanese Patent Application, First Publication No. Hei 9-50888, a problem has been encountered that chips of metal generated by laser machining of the electrode stick again to the surface of the laser machined area, causing short circuits between electrodes and reducing the yield of production.

It is therefore an object of the present invention to provide a method of manufacturing organic EL devices at a high yield by preventing short circuits between electrodes.

SUMMARY OF THE INVENTION

The method of the present invention comprises the steps of, referring to the conceptual construction shown in FIG. 1, forming a plurality of first transparent electrode stripes (anodes) 2 arranged in one direction on a transparent substrate 1;

forming a plurality of insulating partition wall stripes 3 arranged in the direction perpendicular to the direction of said transparent electrode;

forming an organic layer 4 and second electrodes 5 and 6 (cathodes) on said partition wall layers;

adhering a sealing glass cap 7 to said substrate 1 and evacuating the inside of said sealing glass cap 7;

irradiating a laser light from outside of said glass cap on said partition wall layers, and separating second electrodes 5 and 6.

The partition wall stripes are formed by, for example, silicon oxide, silicon nitride, a positive type or negative type of photo-resist, and a dry-film resist. The above second electrodes may be formed by a metal containing titanium or a metal containing carbon. The laser light may be selected from among pulse oscillating lasers with a wavelength of less than 250 nm. The sealing glass cap is vacuum sealed by adhering in an inactive gas atmosphere. The sealing glass cap is preferably transparent to light of a wavelength of less than 250 nm, and preferably made of quartz or synthesized quartz.

That is, the EL device is produced by forming a first electrode 2 (anode) made of ITO or the like, insulating partition wall layers 3, an organic layer 4, a second electrode 5 and a titanium layer 6 successively on the transparent glass substrate, and then by adhering a sealing glass cap to the glass substrate. The inside of the sealed glass cap is then evacuated into vacuum, and a laser light is irradiated from the outside of the sealed glass cap to fuse the second electrode and the titanium layer to divide these layers into two adjacent and mutually isolated layers. Since metal evaporated by the photo-ablation effect, that is, chips of metal stick to the inside wall of the sealing glass cap which is at a lower temperature, chips of metal do not re-stick to the divided portions or separated grooves 10 formed on the insulating partition wall stripes 3. Furthermore, a deoxidation effect is exhibited by the titanium layer 6 which covers the surface of the second electrode 5, because the titanium layer 6 reacts with oxygen gas remaining inside the sealing glass cap 7 to form titanium oxide.

DETAILED DESCRIPTION OF PREFERRED EMBODIMENTS

Figure 1:
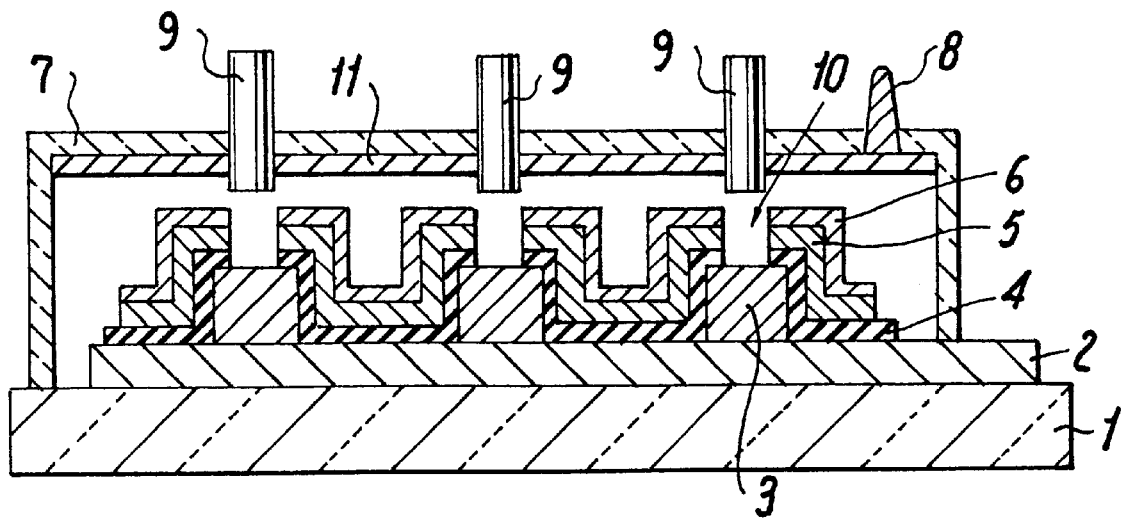
FIG. 1 is a cross sectional view in a process for explaining a manufacturing process of the present invention.
Figure 2A:
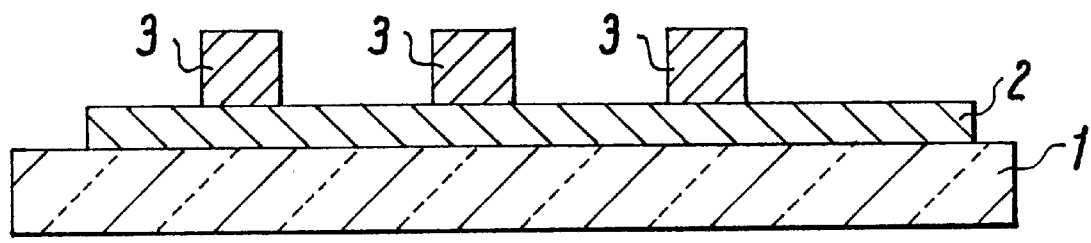
FIGS. 2A to 2D are cross sectional views showing the manufacturing steps of the EL device according to the first embodiment of the present invention.

The detailed description of preferred embodiments will be explained herein with reference to the attached drawings. FIGS. 2A to 2D and FIGS. 3A to 3C show manufacturing steps of the first embodiment of the present invention. As shown in FIGS. 2A and 3A, a plurality of first electrode stripes 2 is formed on one surface of a transparent glass substrate longitudinally at predetermined intervals by an ITO film in the direction from left to right as shown in FIG. 3A. A plurality of partition wall stripes 3 are formed on the first electrode stripes at a predetermined intervals in a direction so as to cross the first electrode stripes 2 at an right angle. The spaces defined by the partition wall stripes 3 are used as an element region for forming elements for luminescence. Here, the partition wall stripes 3 are formed by photolithographic method using a photo-resist, and the partition wall stripes have a width from 20 to 30 μm and a thickness from 2 to 30 μm. At a side region of the first electrode, an outlet electrode 14 is provided for leading a second electrode to the outside, which will be described hereinafter.

Figure 2B:
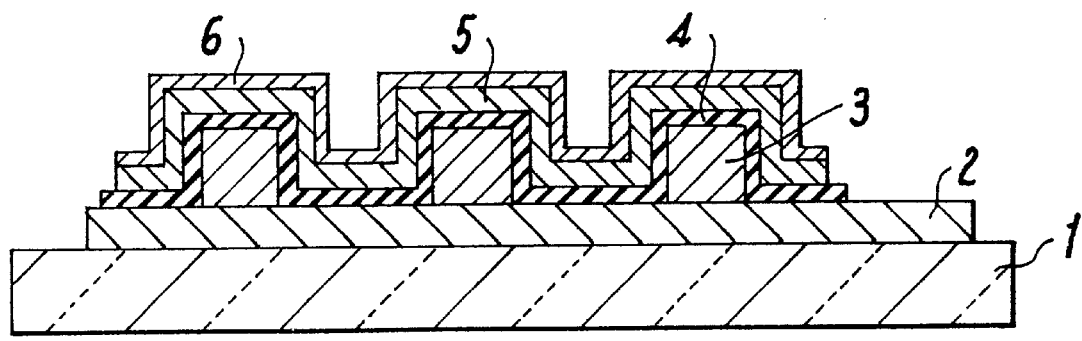
Figure 2C:
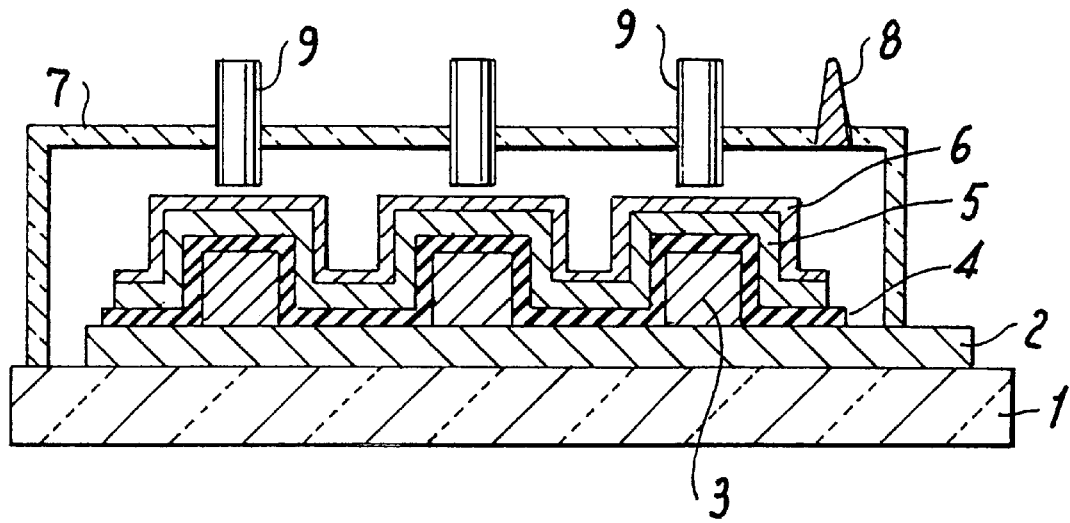
Figure 2D:
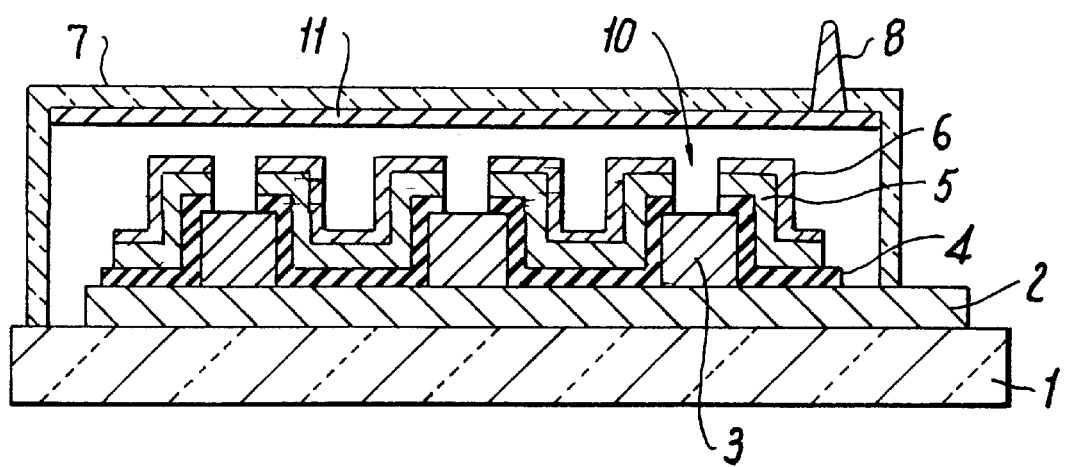
Figure 3A:
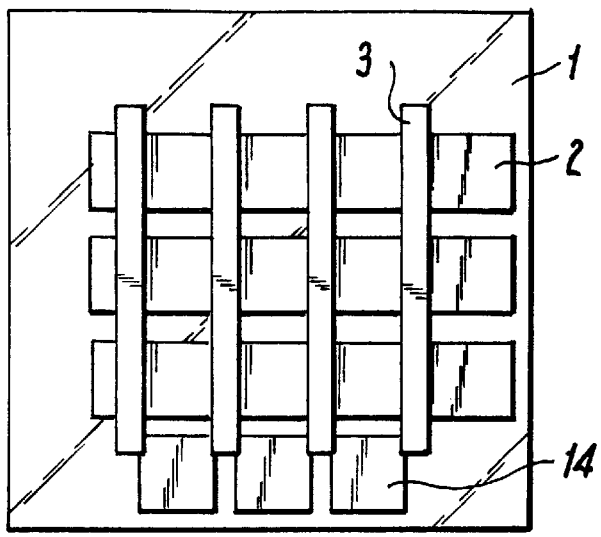
FIGS. 3A to 3C are plan views showing the manufacturing steps of the EL device according to the first embodiment of the present invention.
Figure 3B:
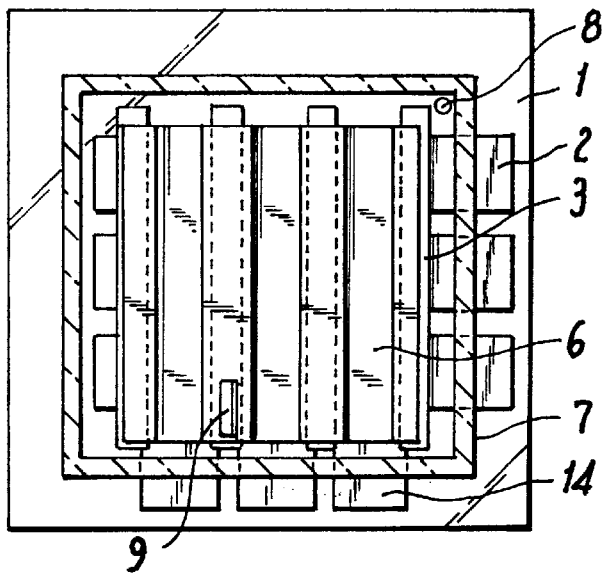
Figure 3C:
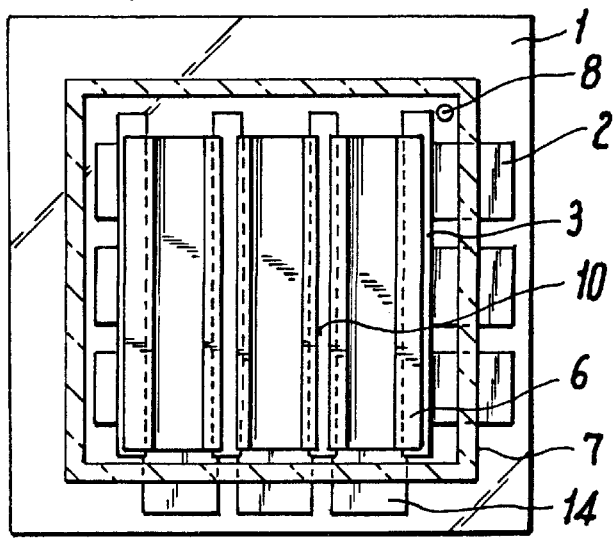
Figure 4:
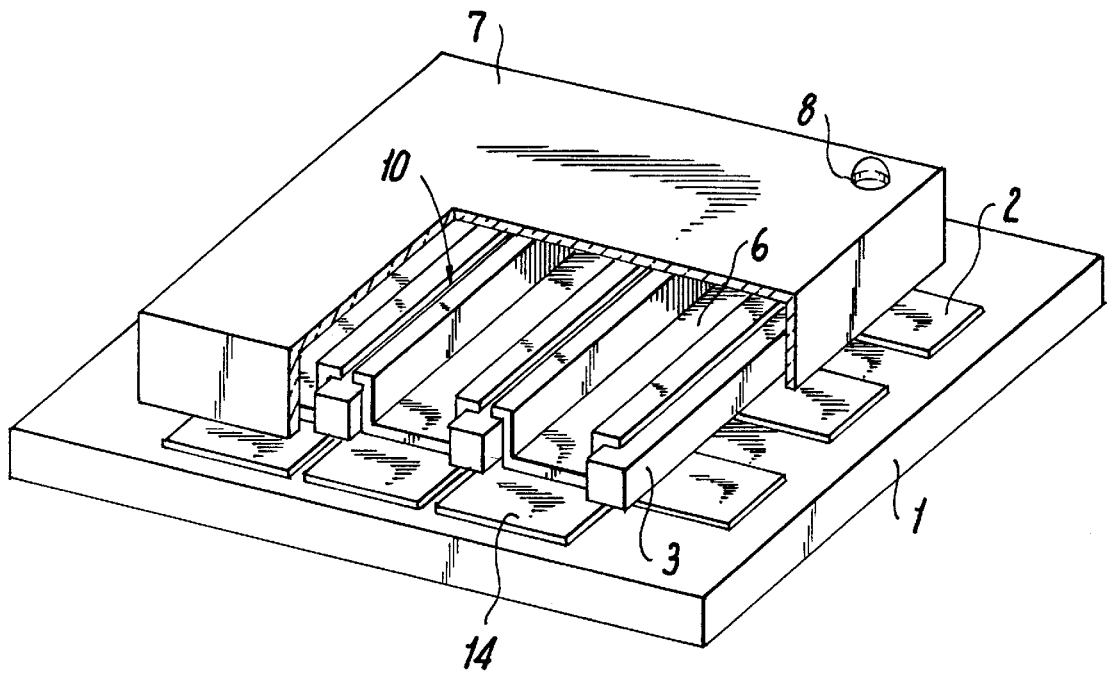
FIG. 4 is a partially exploded view of the organic EL device manufactured by the present invention.

Subsequently, as shown in FIG. 2B, a plurality of layers comprising an organic layer 4, a second electrode 5, and a titanium layer are formed covering the element region, both sides of the partition wall stripes 3, and the partition wall stripes 3. Thereafter, as shown in FIGS. 2C and 3B, a sealing glass cap 7 is bonded on the glass substrate 1, for the purpose of protecting the organic EL device as a whole, the inside of the sealing glass cap 7 is evacuated using a hole formed on the top of the sealing glass cap 7 and the hole 8 is sealed. A laser light 9 is then irradiated towards the upper surface of the partition wall stripes 3 from the outside of the sealing glass cap 7. As shown in FIGS. 2D and 3C, the second electrode 5 and the titanium layer 8 are divided respectively at the upper surface of the partition wall stripes 3 to form divided portions 10. FIG. 4 illustrates a perspective view of the EL device, manufactured by the above process, a part of which is exploded.

In the above structure, a plurality of layers comprising an organic layer 4, a second electrode 5 and a titanium layer 6 are formed on the partition wall layer, and the second electrode 5 including the titanium layer 6 are disconnected and electrically insulated only on upper surfaces of the partition wall stripes 3. By adopting this structure, chips of metal 11 evaporated by the photo-ablation stick to the inner surface of the sealing glass cap 7 so that the divided portion can be prevented from being contaminated by chips of metal. Furthermore, the small amount of oxygen remaining in the sealing glass cap are removed by the titanium layer, so that generation of non-luminous spots called dark spots can be eliminated.

Figure 5A:
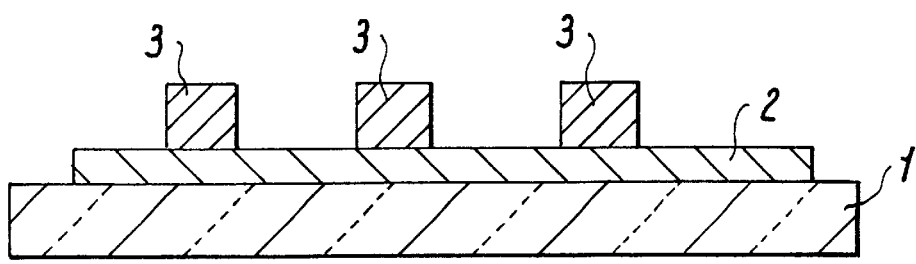
FIGS. 5A to 5D are cross sectional views showing the manufacturing process of the EL device according to the second embodiment of the present invention.
Figure 5B:
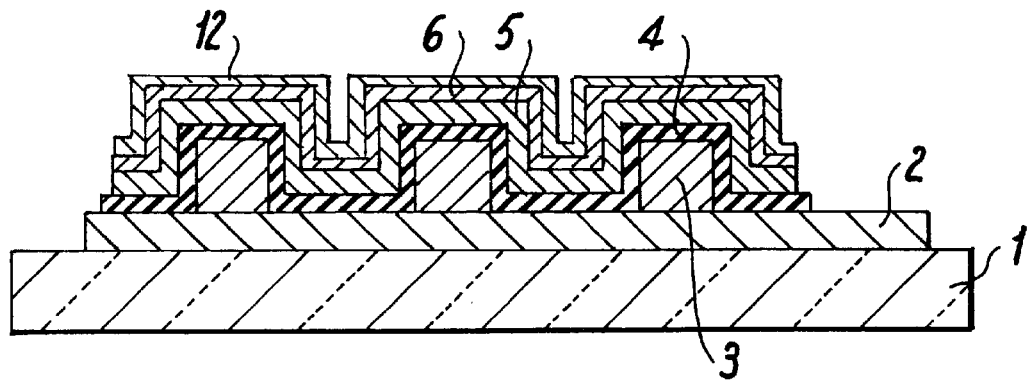
Figure 5C:
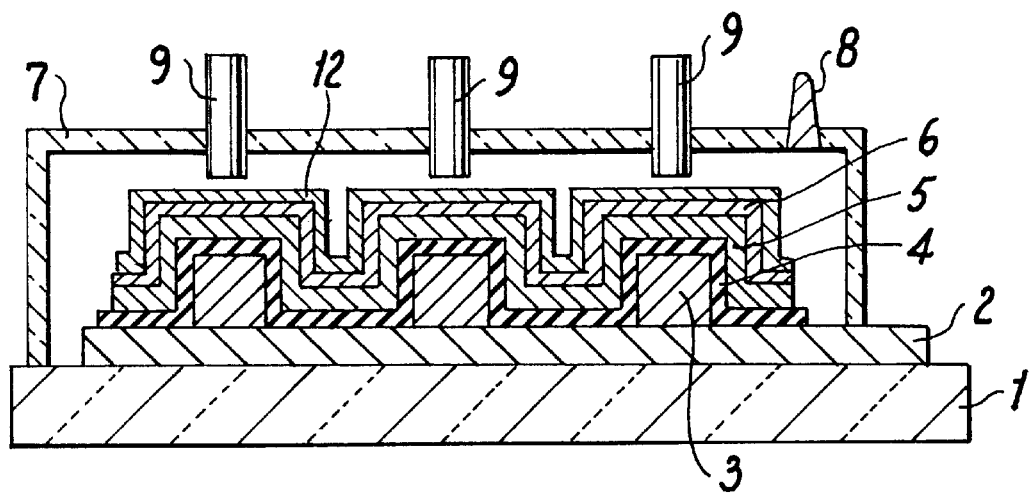
Figure 5D:
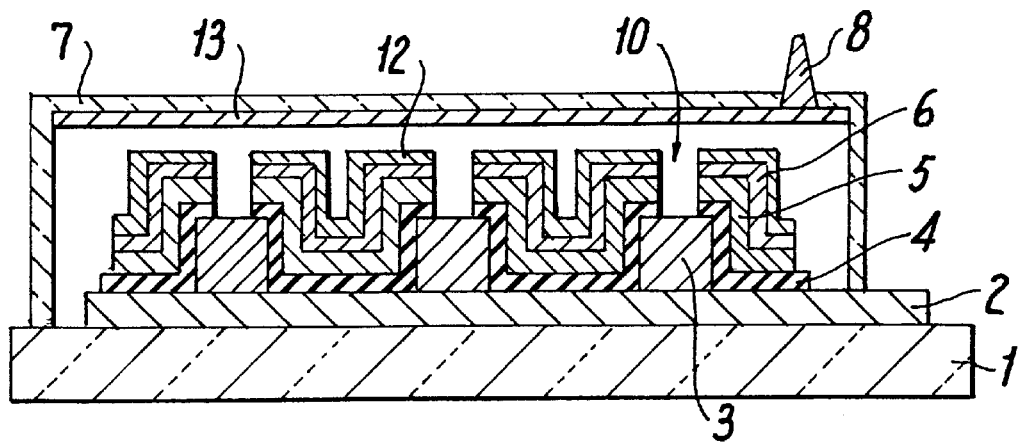
Figure 6A:
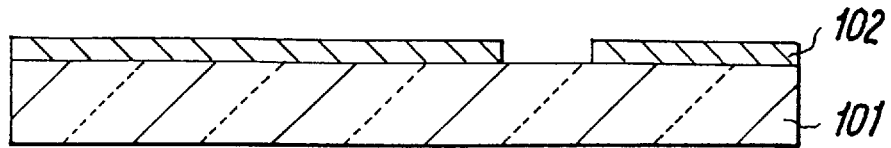
FIGS. 6A to 6E are cross sectional views showing an example of a conventional manufacturing process of an organic EL device.
Figure 6B:
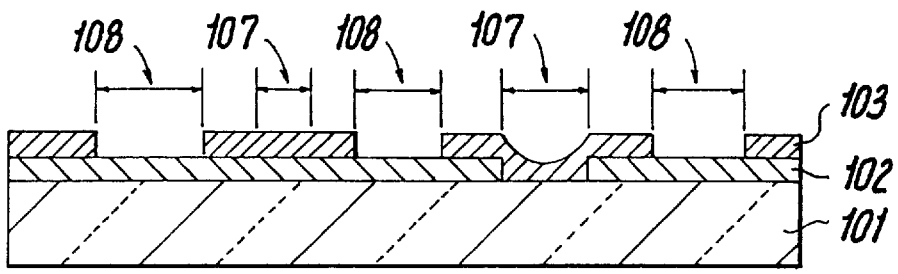
Figure 6C:
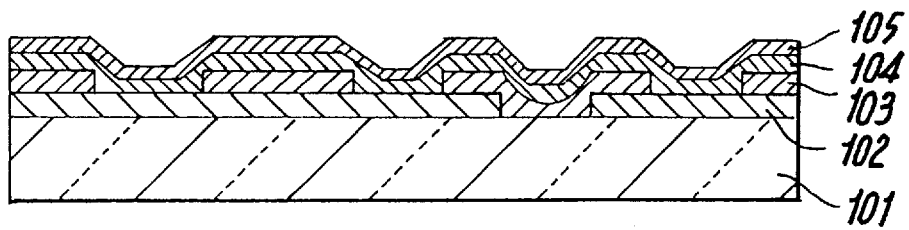
Figure 6D:
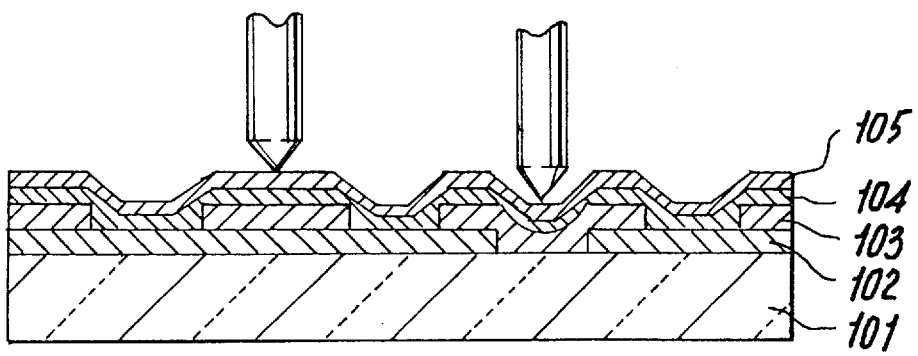
Figure 6E:
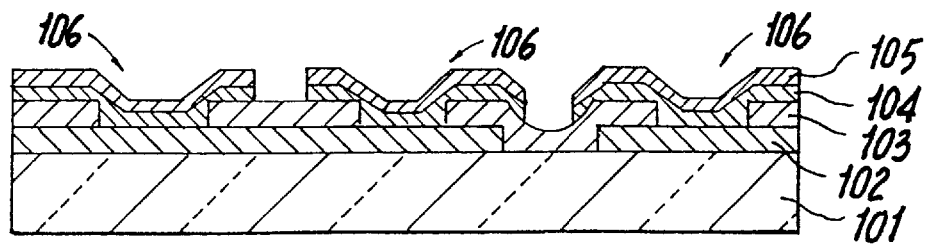
Figure 7A:
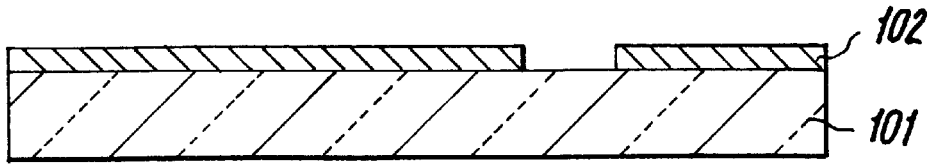
FIGS. 7A to 7E are cross sectional views showing another example of a conventional manufacturing process of an organic EL device.
Figure 7B:
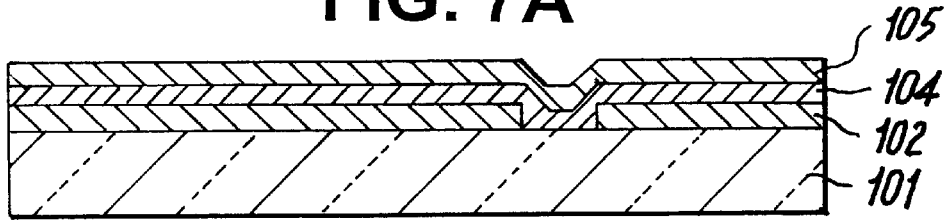
Figure 7C:
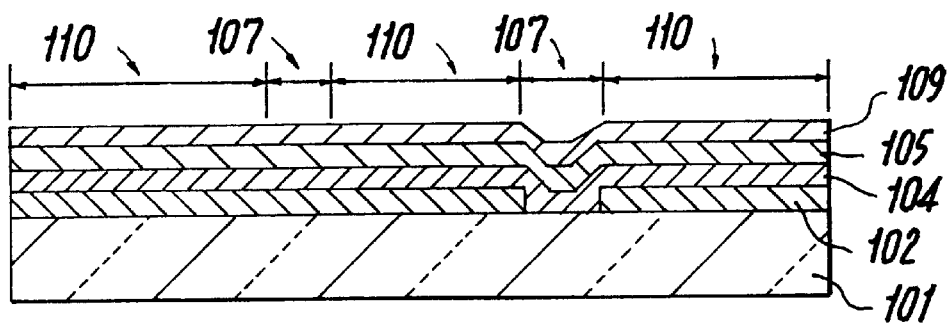
Figure 7D:
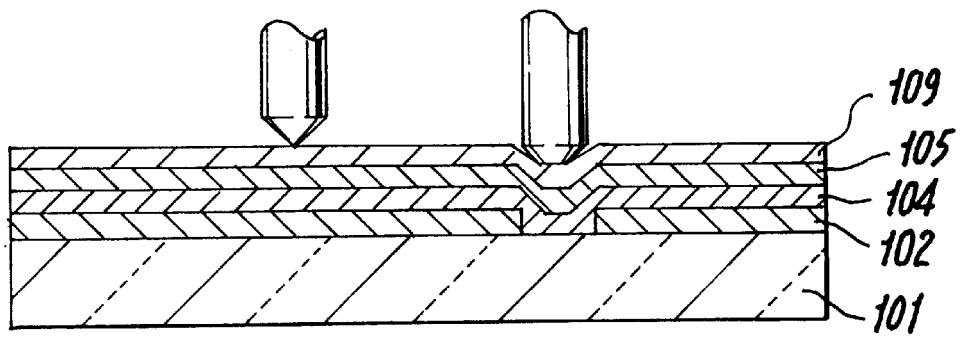
Figure 7E:
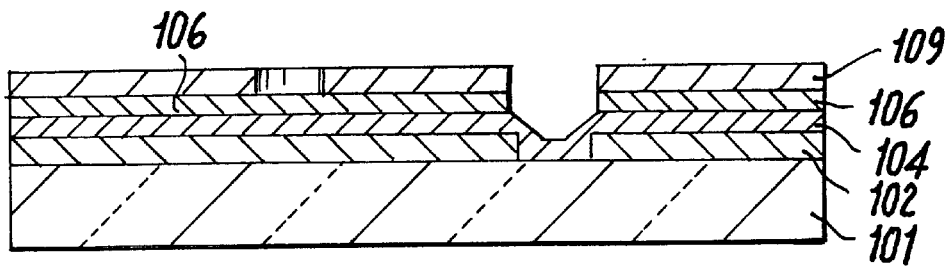
Figure 8A:
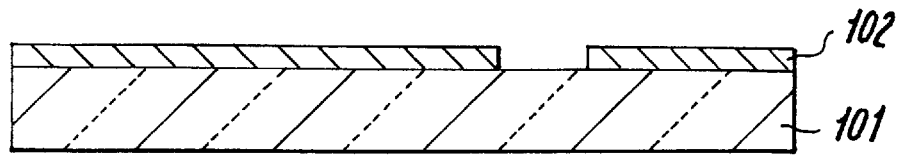
FIGS. 8A to 8E are cross sectional views showing the other example of a conventional manufacturing process of an organic EL device.
Figure 8B:
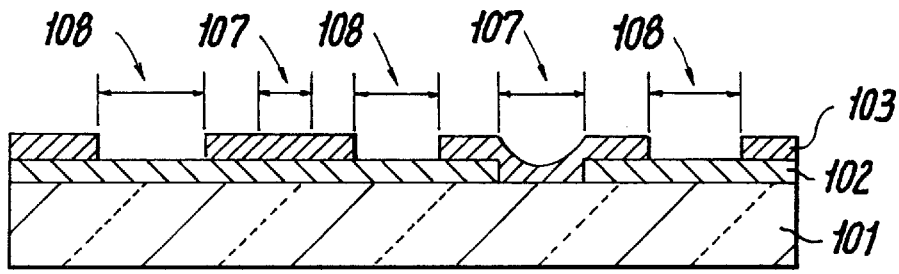
Figure 8C:
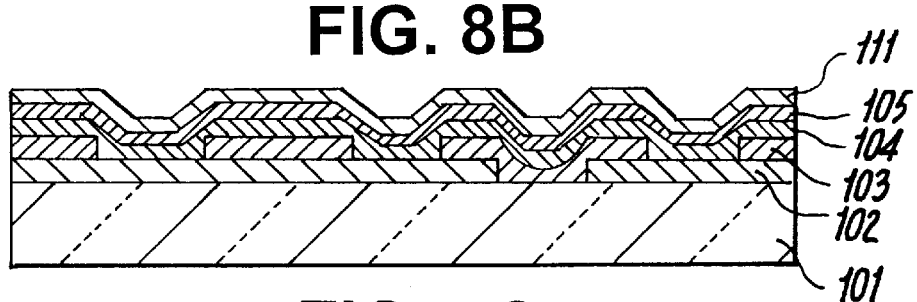
Figure 8D:
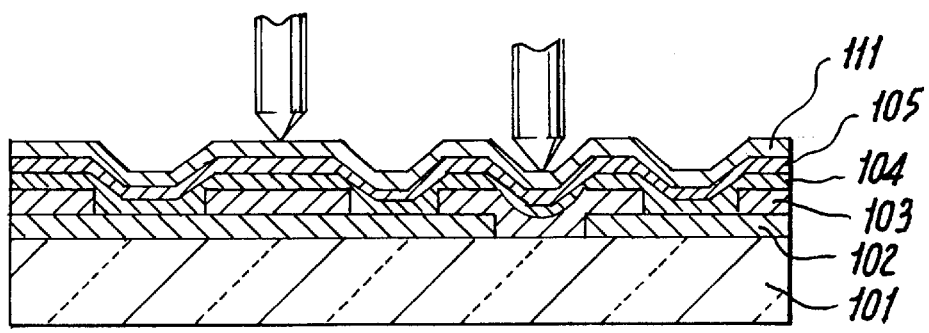
Figure 8E:
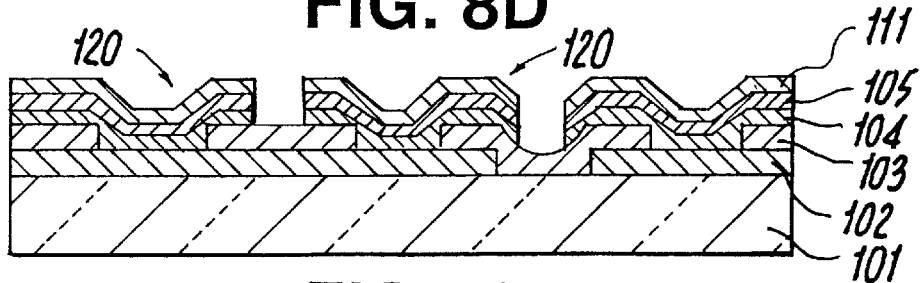

FIGS. 5A to 5D are cross-sectional views of an EL device showing manufacturing steps of the EL device according to the second embodiment of the present invention. The same components as those of the first embodiment are represented by the same numbers. The processes up to the formation of the titanium layer shown in FIGS. 5A and 5B are the same as those of the first embodiment. After the formation of the titanium layer 6, a carbon layer 12 of a thickness of 100 μm is deposited by flowing electric current to a resistance heating boat containing carbon powder. Subsequently, as shown in FIG. 5C, a sealing glass cap 7 is adhered to the glass substrate and, after the inside is evacuated, the laser light 9 is irradiated. Consequently, the second electrode 5 is divided on the surface of the partition wall stripes 3 by the dividing portion 10, as shown in FIG. 5D, and an EL device is constructed with a similar structure to the first embodiment.

In the embodiment, since a metal layer 13 containing carbon is deposited on the inside surface of the sealing glass cap, the transparent portion of the partition wall portion is turned black, which is effective for increasing the contrast in the visible range between the EL device corresponding to the luminous parts and the element-separating portion corresponding to the non-luminous part.

EXAMPLE 1

Referring again to FIG. 2A to 2D, an example of the present invention will be described hereinafter in detail. As shown in FIG. 2A, a glass plate with a thickness of 1.1 mm was used as a glass substrate 1. It is preferable to use a non-alkali glass which does not include alkali component. However, it was confirmed that a low price low-alkali glass plate or a soda-lime glass with a cover coat of silicon oxide for restricting the elusion can be used. An ITO film with a thickness of 100 nm was formed by sputtering on one side of the glass substrate 1. The first electrode 2 was formed by a photolithographic technique by patterning the ITO film into a plurality of stripes extending in the direction from left to right of FIG. 2A. In this construction, it is necessary for the ITO film forming the first electrode 2 to have low resistivity and have higher transparency, since it acts as an anode electrode and, at the same time, the film acts as a light transmission layer to the luminescence emitted by the organic layer 4. The ITO film stripes as the first electrode 2 were formed at a line pitch of 0.33 mm, a line width of 0.3 mm, and a length of 28 mm, and 128 stripes were formed on the glass substrate.

A partition wall layer 3 was then formed so as to cross the ITO stripes forming the first electrode 2 at a right angle. A resist film with a thickness of 5 μm was formed by spin coating a positive-type photo-resist which is a product by Tokyo Ouka Kogyo Co. Ltd., under the trade name of "OFPR800". The positive-type photo-resist was heat treated at 90° C. for 30 minutes, and exposed to a light with a wavelength of 438 nm at an exposure rate of 60 mJ. After the exposure, the resist was developed by a TMAH with a concentration of 2.38% for 70 sec., and, after washing with water, and by a baking treatment at 130° C. for 30 min. a plurality of partition wall stripes 3 were formed at a width of 30 μm, which is perpendicular to first electrode stripes. The partition wall stripes 3 have a pitch of 0.33 mm and a height of 2 to 5 μm, and both side surfaces of each stripe were substantially vertical to the surface of the glass substrate 1.

The substrate shown in FIG. 2B was held at a position where the partition wall stripes 3 are facing to the downward direction. The resistance heating boat was filled with N,N'-diphenyl-N,N'-bis(α-naphtyl)-1,1'-biphenyl-4,4'-diamine (hereinafter, called α-NPD). Another resistance heating boat was filled with tris(8-quinolite) aluminum complex (hereinafter, called Alq 3). The vacuum chamber was evacuated to less than a 1×10 Torr, and the resistance heating boat with α-NPD was heated by flowing current, and α-NPD was deposited on the substrate at a thickness of 50 nm, while the substrate was rotating. While the substrate was continuously rotating, Alq 3 film with a thickness of 50 nm was then deposited on the α-NPD film, by flowing current to the resistance heating boat with Alq 3. Thereby, the organic layer 4 which includes a hole transporting layer, a luminescence layer and an electron transporting layer was formed by deposition process. Furthermore, the other resistance heating boats containing magnesium and silver, respectively, were introduced into a vacuum chamber with the thus deposited substrate, and an electrode at a thickness of 300 nm was deposited at the same time at an deposition ratio of magnesium:silver of 10:1. A resistance heating boat containing titanium was then heated to deposit a titanium layer at a thickness of 100 nm on the magnesium-silver electrode.

Subsequently, as shown in FIG. 2C, a sealing glass cap made of quartz was adhered to the glass substrate 1 in nitrogen atmosphere in a glove-box for protecting the deposited EL layers. The inside of the sealing glass cap was evacuated to a level of 10 Pa by an oil sealed rotary vacuum pump through a hole 8 mounted at the top surface of the sealing glass cap 7, and after then the hole 8 was sealed. A laser beam with a wavelength of 248 nm emitted by a KrF excimer laser 9 was irradiated from the outside of the sealing glass cap 7 by moving along the longitudinal direction of the partition wall 3 under conditions of a repetition frequency of 20 Hz, a beam size of 7 mm×10 mm, and a beam aperture of 25 $\mu$m×3 $\mu$m. Consequently, as shown in FIG. 2D, a divided portions 10 at which the electrode 5 were divided and insulated from each other was formed on the upper surface of the partition wall 3. In addition, it was confirmed that chips of metal 11 evaporated by the photo-ablation by laser light irradiation stuck to the inside wall of the sealing glass cap, and the divided portion 10 of the El device was not contaminated with chips of metal.

As explained hereinabove, chips of metal evaporated at the time of the division of the second electrode by the laser light irradiation do not contaminate the divided portion 10, because the division is carried out in a sealing glass cap evacuated in a vacuum and the chips of metal sticks to the inside wall of the sealing glass cap which remains at a lower temperature than that of the irradiated portion, which results in preventing the short circuit by the metal chips and increasing the yield of the manufacturing process. Since the second electrode is formed in combination with the titanium layer, so that the outgassing of oxygen caused by melting by laser irradiation can be absorbed by the titanium layer by the deoxidation effect of titanium, which results in the prevention of the generation of dark spots which are non-luminous spots during the operation of the EL device and contributes to an increase in the operation life of the EL device. Moreover, the second electrode is formed containing carbon, so that the surface of the partition wall 3 after the removal of the second electrode changes from the original translucency to black, which contributes to an increase in the contrast in the visible light range between the luminous EL elements and the non-luminous partition wall area, because carbon included in the second electrode is deposited on the inside wall of the sealing glass cap at fusion and division of the second electrode by the laser light. In addition, the division of the second electrode is conducted by an excimer laser light of a wavelength of 248 nm, which is effective to low-temperature machining and which avoid causing a heat damage to the EL elements, since the heat diffusion distance is as low as 20–30 nm, due to the high photon energy of the excimer laser and the high peak output intensity of the laser light based on short pulsive laser emission.

What is claimed is:

1. A method of manufacturing an EL device comprising the steps of:

forming a plurality of first electrode stripes extending longitudinally in one direction on a surface of a substrate;

forming a plurality of insulating partition wall stripes on said first electrode stripes extending longitudinally in a direction perpendicular to said first electrode stripes;

forming an organic layer comprising a hole transporting layer, a luminescence layer, and an electron transporting layer on said partition wall stripes, and forming a second electrode layer on said organic layer;

adhering a sealing glass cap so as to cover said first electrode, said partition wall, said organic layer, and said second electrode, and evacuating the inside of said sealing glass cap; and irradiating a laser light from the outside of said sealing glass cap toward said partition wall for dividing said second electrode and said organic layer so as to form a divided groove on said partition wall.

2. A method of manufacturing an EL device according to claim 1, wherein said partition layer is formed by a film made by a material selected from a group consisting of silicon oxide, silicon nitride, a positive-type and a negative type of photoresist, and a dry-film resist.

3. A method of manufacturing an EL device according to claim 1, wherein said second electrode is made of a metal selected from a group consisting of a metal containing titanium and a metal containing titanium and carbon.

4. A method of manufacturing an EL device according to claim 1, wherein said laser light is a pulse oscillating laser light with a wavelength of less than 250 nm.

5. A method of manufacturing an EL device according to claim 1, wherein said sealing glass cap is first adhered by gluing to said glass substrate and, after adhering, the inside of said sealing glass cap is evacuated.

6. A method of manufacturing an EL device according to claim 1, wherein said sealing glass cap is made of a material which is transparent to light of a wavelength of 250 nm, and the material is preferably selected from a group consisting of quartz or artificial quartz.

* * * * *